(12) United States Patent
Song

(10) Patent No.: US 11,342,389 B2
(45) Date of Patent: May 24, 2022

(54) DISPLAY PANEL INCLUDING TOUCH SENSOR, DISPLAY PANEL COMPRISING THE SAME AND METHOD FOR DETECTING DEFECT THEREOF

(71) Applicant: LG Display Co., Ltd., Seoul (KR)

(72) Inventor: Eun-Ah Song, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/238,788

(22) Filed: Apr. 23, 2021

(65) Prior Publication Data

US 2021/0242286 A1 Aug. 5, 2021

Related U.S. Application Data

(62) Division of application No. 16/719,094, filed on Dec. 18, 2019, now Pat. No. 11,018,203.

(30) Foreign Application Priority Data

Dec. 31, 2018 (KR) .......................... 10-2018-0173613

(51) Int. Cl.
*H01L 27/32* (2006.01)
*G06F 3/044* (2006.01)
*G06F 3/041* (2006.01)
*H01L 51/52* (2006.01)

(52) U.S. Cl.
CPC .......... *H01L 27/323* (2013.01); *G06F 3/0445* (2019.05); *G06F 3/0446* (2019.05); *H01L 27/3276* (2013.01); *H01L 51/5253* (2013.01); *G06F 2203/04102* (2013.01); *G06F 2203/04107* (2013.01); *G06F 2203/04112* (2013.01)

(58) Field of Classification Search
None
See application file for complete search history.

(56) References Cited

U.S. PATENT DOCUMENTS

| 10,817,090 | B2 | 10/2020 | Gwon et al. | |
|---|---|---|---|---|
| 10,890,995 | B2 | 1/2021 | Lee et al. | |
| 2014/0197845 | A1* | 7/2014 | Ko | G06F 3/0446 324/537 |
| 2018/0059855 | A1* | 3/2018 | Gwon | G06F 3/04164 |
| 2018/0061899 | A1 | 3/2018 | Oh et al. | |
| 2018/0190170 | A1* | 7/2018 | Yang | G01R 31/31728 |
| 2018/0308903 | A1* | 10/2018 | Jeong | G06F 3/0445 |

(Continued)

*Primary Examiner* — Sepehr Azari
(74) *Attorney, Agent, or Firm* — Birch, Stewart, Kolasch & Birch, LLP

(57) ABSTRACT

A display panel, a display device comprising the display panel, and a method for detecting a defect thereof are provided. The method can include preparing the display panel including a first sensing pattern connected to a touch sensor and a second sensing pattern extended from a light emitting device in an active area of the display panel to a non-active area of the display panel, wherein at least one of the first sensing pattern and the second sensing pattern protrudes farther than an end of an encapsulation stack, and the encapsulation stack covers a second electrode of the light emitting device in the active area; detecting a parasitic capacitance between the touch sensor and the second electrode in the active area; comparing the parasitic capacitance with a designated value; and determining that the display panel is defective based on a result of the comparing.

22 Claims, 8 Drawing Sheets

(56) References Cited

U.S. PATENT DOCUMENTS

| | | |
|---|---|---|
| 2018/0350884 A1 | 12/2018 | Won et al. |
| 2018/0358413 A1 | 12/2018 | Lee et al. |
| 2018/0366520 A1 | 12/2018 | Gwon et al. |
| 2019/0066595 A1* | 2/2019 | Kim .................... G09G 3/3258 |

* cited by examiner

DISPLAY PANEL INCLUDING TOUCH SENSOR, DISPLAY PANEL COMPRISING THE SAME AND METHOD FOR DETECTING DEFECT THEREOF

CROSS-REFERENCE TO RELATED APPLICATION

This application is a Divisional of copending U.S. patent application Ser. No. 16/719,094, filed on Dec. 18, 2019, which claims the priority benefit of the Korean Patent Application No. 10-2018-0173613, filed on Dec. 31, 2018 in the Republic of Korea, all of these applications are hereby incorporated by reference as if fully set forth herein into the present application.

BACKGROUND OF THE INVENTION

Field of the Invention

The present invention relates to a display panel and a display device, and more particularly, to a display panel including a touch sensor having a sensing pattern to detect a defect by changing the configuration of an array, a display comprising the same, and a method for detecting a defect thereof.

Discussion of the Related Art

Image display devices, which display various pieces of information on a screen, are a core technology in the age of information and communication and have been developed to satisfy thinness, light-weight, portability and high-performance trends. Therefore, an organic light emitting diode (OLED) display device including self-luminous devices, which can reduce weight and volume to make up for drawbacks of a cathode ray tube (CRT), is now in the spotlight. Such an organic light emitting diode display device includes self-luminous devices without separate light source units, and thus has advantages, such as low power consumption, high response speed, high luminous efficacy, high brightness and wide viewing angle.

Further, such an organic light emitting diode display device including self-luminous devices mainly uses organic thin films having flexibility and elasticity, and can thus be easily implemented as a flexible display device. The flexible display device can include a touch sensor at an upper portion thereof so as to react to a user's touch operation.

Further, in the flexible display device, the thicknesses of respective layers should be small so as to achieve flexibility. In this case, a parasitic capacitance generated at overlapping parts between the touch sensor and a lower metal pattern can cause a touch recognition error in touch sensing, and thus it is necessary to manage such parasitic capacitance prior to any product launch.

However, general display devices including a touch sensor are not provided with any unit to discriminate a parasitic capacitance between the touch sensor and the lower metal pattern. Thereby, in a flexible display device of the related art, in particular, a touch recognition error can occur frequently.

SUMMARY OF THE INVENTION

Accordingly, the present invention is directed to a display panel including a touch sensor and a method for detecting a defect thereof that substantially obviate one or more problems due to limitations and disadvantages of the related art.

An object of the present invention is to provide a display panel including a touch sensor having a sensing pattern to detect a defect by changing an array configuration, and a method for detecting a defect thereof.

Another object of the present invention is to provide a display panel including a touch sensor in which specific sensing patterns are provided so that a capacitance between the touch sensor and a second electrode is measured through parts of the sensing patterns exposed to a non-active area, and thus whether or not the display panel is defective can be measured in a panel state.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a display panel can comprise a substrate including an active area having a plurality of subpixels and a non-active area to surround the active area, at least one thin film transistor in each of the subpixels, a light emitting device comprising a first electrode connected to the at least one thin film transistor, and a light emitting layer and a second electrode, an encapsulation stack comprising at least one organic encapsulation film and at least one inorganic encapsulation film configured to cover the light emitting device, a touch sensor comprising a plurality of touch electrodes formed on the encapsulation stack in the active area, and a first sensing pattern and a second sensing pattern located in the non-active area and respectively connected to the touch sensor and the second electrode, at least one of the first sensing pattern and the second sensing pattern protruding farther than an end of the encapsulation stack in an outward direction.

In another aspect of the present invention, a display device comprises a display panel as discussed above and driving units for driving the display panel.

In still another aspect of the present invention, a method for detecting a defect of the above-described display panel, can comprise preparing a display panel including a first sensing pattern connected to a touch sensor and protruding farther than an end of the encapsulation stack in a non-active area of the display panel and a second electrode in an active area and non-active area to overlap with the first sensing pattern, detecting a parasitic capacitance between the touch sensor and the second electrode in the active area, by measuring a capacitance between the first sensing pattern and the second sensing pattern connected to the second electrode, located in the non-active area and determining whether or not the display panel is defective by comparing the parasitic capacitance with a designated value.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
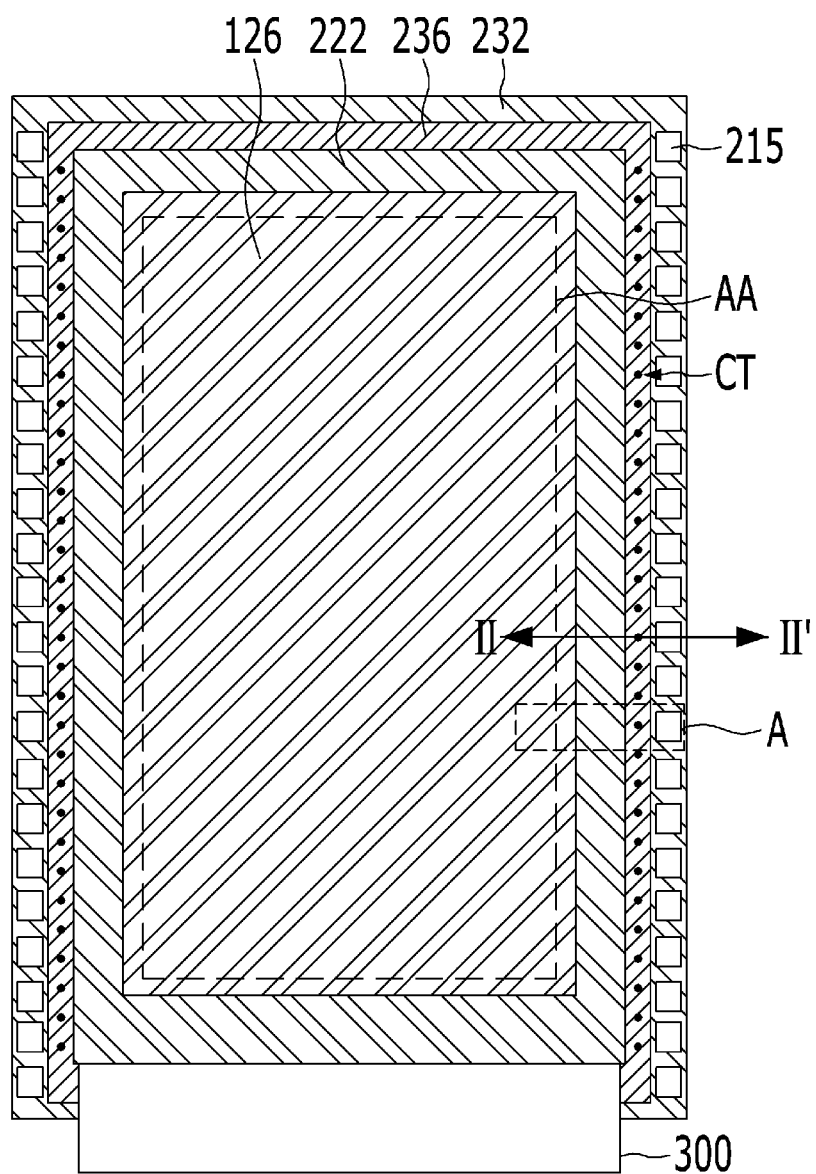
FIG. 1 is a plan view of a display panel in accordance with one or more embodiments of the present invention.

Reference will now be made in detail to the preferred embodiments of the present invention, examples of which are illustrated in the accompanying drawings. In the following description of the embodiments and the drawings, the same or similar elements are denoted by the same reference numerals even though they are depicted in different drawings. In the following description of the embodiments of the present invention, a detailed description of known functions and configurations incorporated herein will be omitted when it can make the subject matter of the present invention rather unclear. Further, the names of elements used in the following description of the embodiments of the present invention are selected in consideration of ease in preparation of the specification, and can thus differ from the names of parts of an actual product.

Shapes, sizes, rates, angles, numbers, etc. disclosed in the drawings to describe the embodiments of the present invention are only exemplary and do not limit the present invention. In the following description of the embodiments, the terms 'including', 'having', 'consisting of', etc. will be interpreted as indicating presence of one or more other characteristics, numbers, steps, operations, elements or parts stated in the specification or combinations thereof, and do not exclude presence of characteristics, numbers, steps, operations, elements, parts or combinations thereof, or possibility of adding the same, unless the term 'only' is used. It will be understood that a singular expression of an element encompasses a plural expression of the element unless stated otherwise.

In interpretation of elements included in the various embodiments of the present invention, it will be interpreted that the elements include error ranges even if there is no clear statement.

In the following description of the embodiments, it will be understood that, when positional relations are expressed, for example, when an element is 'on', 'above', 'under', 'beside', etc. another element, the two elements can directly contact each other, or one or more other elements can be interposed between the two elements unless the term 'just' or 'directly' is used.

In the following description of the embodiments, it will be understood that, when temporal relations are expressed, for example, a term expressing a sequence of events, such as 'after', 'subsequent to', 'next to' or 'before' can encompass continuous relationship between the events, or discontinuous relationship between the events unless the term 'just' or 'directly' is used.

In the following description of the embodiments, it will be understood that, when the terms 'first', 'second', etc. are used to describe various elements, these terms are used merely to discriminate the same or similar elements. Therefore, an element modified by the term 'first' can be the same as an element modified by the term 'second' within the technical scope of the invention unless stated otherwise.

Characteristics of the various embodiments of the present invention can be partially or entirely connected to or combined with each other and technically variously driven and interlocked with each other, and the respective embodiments can be independently implemented or be implemented together in connection with each other.

Figure 2:
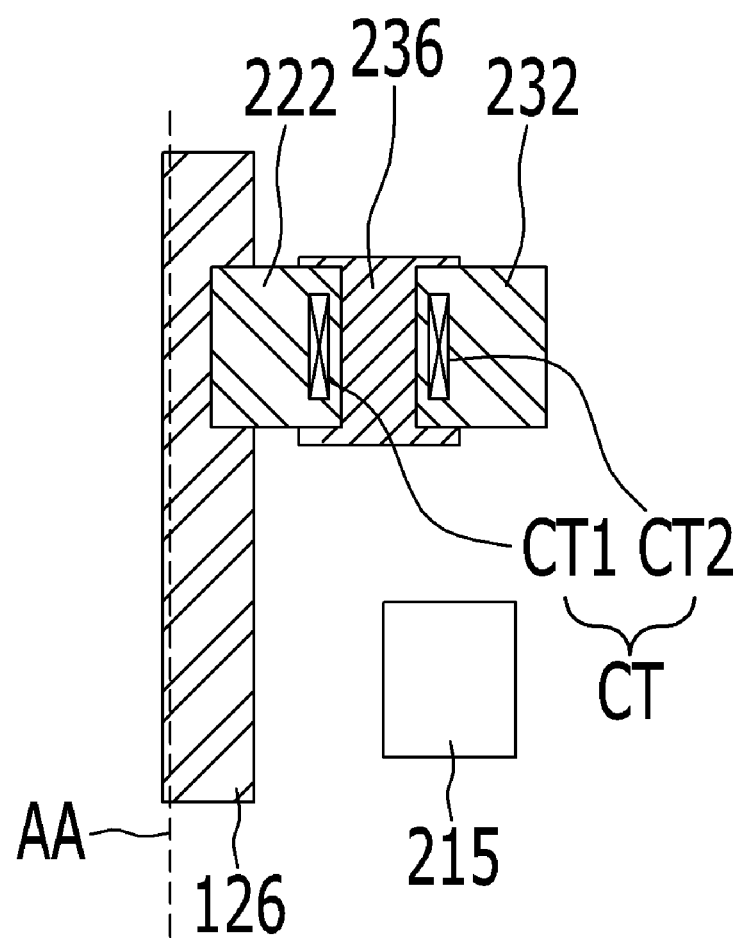
FIG. 2 is an enlarged view of a portion A of FIG. 1.
Figure 3:
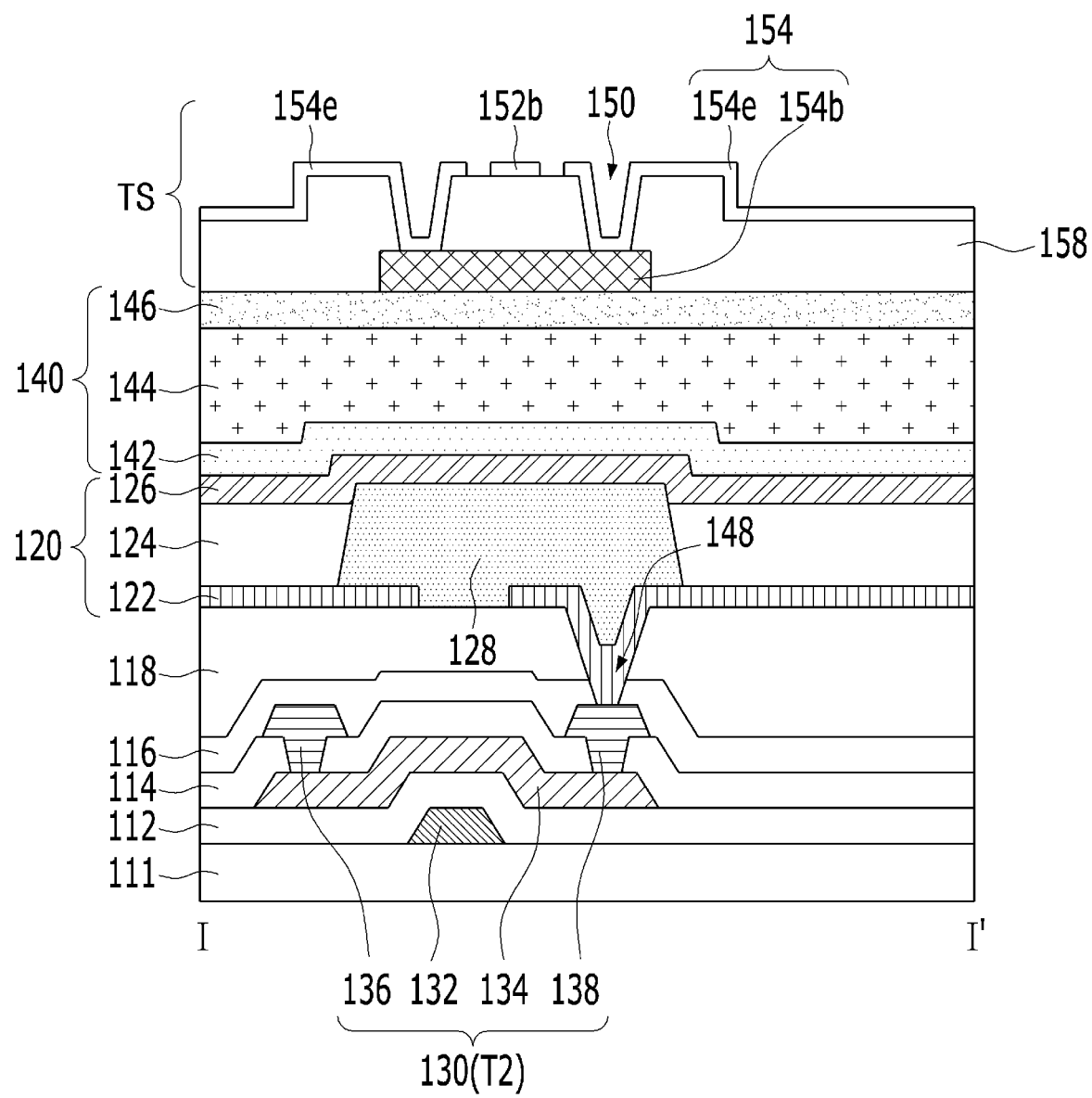
FIG. 3 is a cross-sectional view of an active area of the display panel of FIG. 1, taken along line I-I' along two adjacent touch electrodes in one direction (X direction or Y direction)
Figure 4:
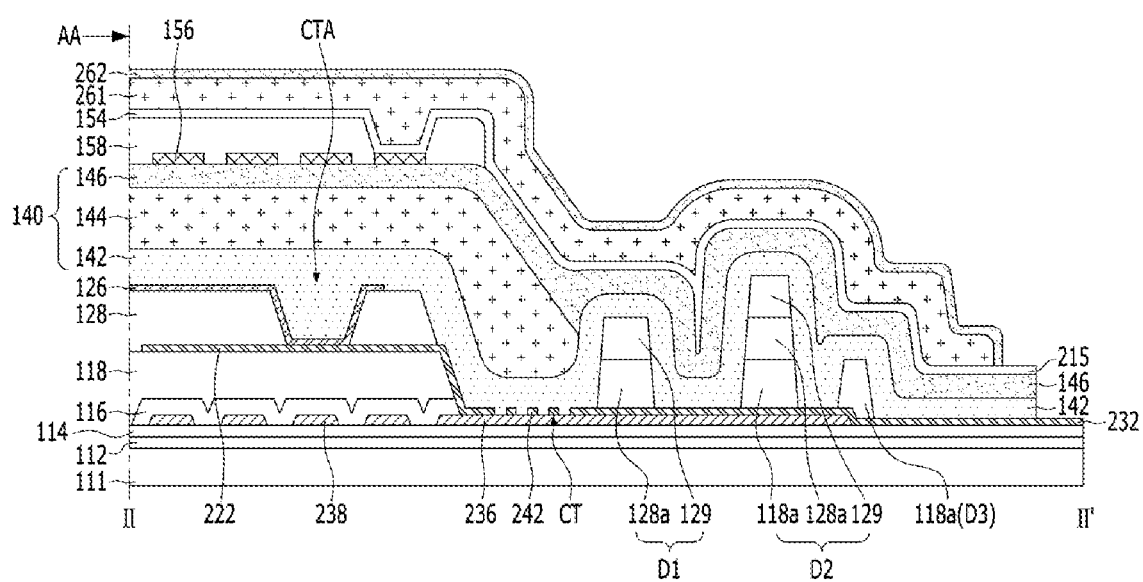
FIG. 4 is a cross-sectional view of the display panel of FIG. 1, taken along line II-II'.
Figure 5:
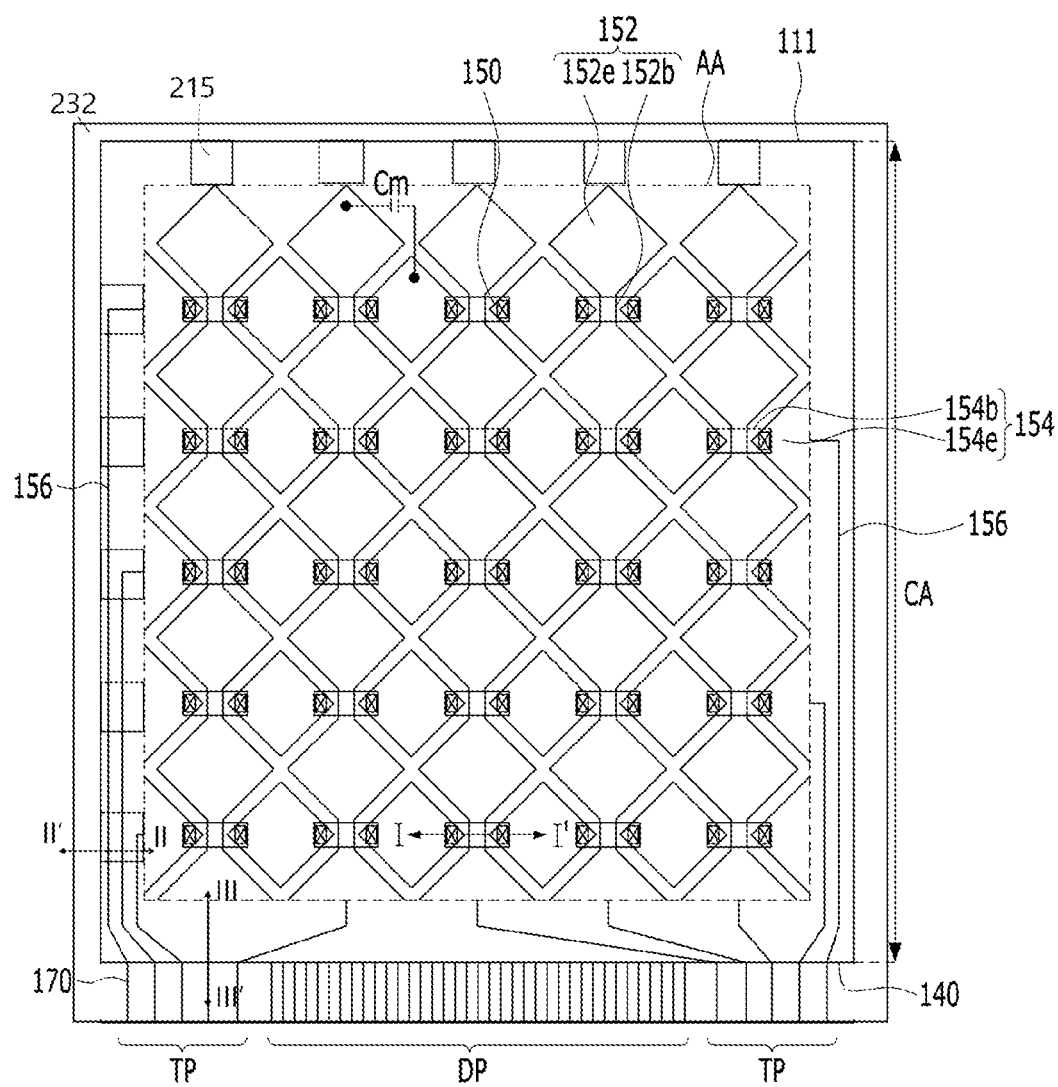
FIG. 5 is a plan view illustrating the configurations of a touch sensor and a first sensing pattern of a display panel in accordance with one embodiment of the present invention.

FIG. 1 is a plan view of a display panel in accordance with the present invention, and FIG. 2 is an enlarged view of a portion A of FIG. 1. FIG. 3 is a cross-sectional view of an active area of the display panel of FIG. 1, taken along line I-I' along two adjacent touch electrodes in one direction (X direction or Y direction), and FIG. 4 is a cross-sectional view of the display panel of FIG. 1, taken along line FIG. 5 is a plan view illustrating the configurations of a touch sensor and a first sensing pattern of a display panel in accordance with one embodiment of the present invention. All components of the display panel according to all embodiments of the present invention are operatively coupled and configured.

The display panel in accordance with one or more embodiment of the present invention which will be described below basically includes a substrate, and an array and a touch sensor on the substrate. The display device includes the array and the touch sensor on the substrate without a drive unit, and can thus be referred to as a display panel (unit panel). The display panel in accordance with one or more embodiment of the present invention having the above basic configuration has a structure in which a defect can be detected, and particularly the defect can be sensed under the condition that the display panel is not connected to a drive unit, such as a signal transmission film or a printed circuit board. The display panel in accordance with one or more embodiment of the present invention can be extended to a state in which a drive unit is additionally connected to the display panel or a drive unit is connected to the display panel and a case to protect the external appearance of the display panel is additionally provided.

As exemplarily shown in FIGS. 1 to 4, the display panel in accordance with one or more embodiment of the present invention includes a substrate 111 having an active area AA (an area within a dotted line of FIG. 1) having a plurality of subpixels and a non-active area surrounding the active area AA, at least one thin film transistor 130 provided in each of the subpixels, a light emitting device 120 including a first electrode 122 respectively connected to the thin film transistor 130 and a light emitting layer 124 and a second electrode 126 sequentially formed on the first electrode 122, an encapsulation stack 140 including at least one organic encapsulation film 144 and at least one inorganic encapsulation film 142 and 146 configured to cover the light emitting device 120, touch sensor TS including a plurality of touch electrodes 152 and 154 formed on the encapsulation stack 140 over the active area AA, and a first sensing pattern 215 extending from at least one of the touch electrode 152 or 154 to the non-active area.

The display panel in accordance with one or more embodiment of the present invention has features in the non-active area.

In order to detect a capacitance between the first sensing pattern 215 formed integrally with the touch electrodes 152 and 154 and the second electrode 126 overlapping the first sensing pattern 215, a second sensing pattern 232 having a conductive connection part with the second electrode 126 is provided around the first sensing pattern 215.

First, a significance of measurement of the capacitance between the first sensing pattern 215 and the second electrode 126 in the display panel will be described.

The light emitting device 120 is provided in each of the subpixels provided in the active area AA, the first electrode 122 of the light emitting device 120 is patterned according to the respective subpixels, and the thin film transistor 130 is connected to the first electrode 122 so that the respective subpixels can separately receive an electrical signal. On the other hand, the second electrode 126 is formed as an integrated type to cover at least the active area AA, as exemplarily shown in FIG. 1, and a constant phase voltage signal of common voltage and ground voltage is applied thereto.

The second electrode 126 can partially protrude to the non-active area and be connected to power lines 238 arranged thereunder so as to receive an electrical signal applied from the power line 238. For example, the second electrode 126 is formed as an integrated type to have a greater area than the active area AA. In this case, the power line 238 and a connection metal 236 can be formed in the same layer and electrically connected, and the connection metal 236 is connected to the second electrode 126 extending to the non-active area through a first auxiliary sensing pattern 222. The connection metal 236 and the power lines 238 can be located in the same layer as source/drain electrodes 136 and 138, as exemplarily shown in the drawings, or be located in the same layer as a gate electrode 132. Otherwise, the connection metal 236 can be located in the same layer as various types of wirings provided in the active area AA, be located between the first auxiliary sensing pattern 222 and the second sensing pattern 232 so as to perform functions thereof, and overlap the first auxiliary sensing pattern 222 and the second sensing pattern 232 to form conductive connections CT between the two patterns 222 and 232 having different interlayer structures and spaced apart from each other in a planar fashion.

Such a second electrode 126 is provided to cover the entirety of the active area AA, as exemplarily shown in FIG. 1, and thus inevitably overlaps the touch electrodes 152 and 154 of the touch sensor TS located thereon.

The touch sensor TS detects whether or not a touch occurs by sensing a change in the mutual capacitance between the first and second touch electrodes 152 and 154, and, since, when the parasitic capacitance between the second electrode 126 and the first or second touch electrode 152 or 154 has a great value, the first and second touch electrodes 152 and 154 serve as common nodes in mutual capacitance and parasitic capacitance, a value of the mutual capacitance detected by the touch sensor TS is decreased, and thereby, accuracy in touch detection can be lowered.

Recently, application fields of display panels can be gradually increased and thus the display panels can be applied to various types of home appliances or mirrors, dashboards, navigation systems and windshields of vehicles, in addition to notebooks, monitors, mobile terminals and e-books. Further, application of the display panels as having various types is required. For example, various types of display panels, such as not only a flexible display panel attached to specific home appliance or furniture and requiring curvature, but also foldable, rollable and bendable display panels, are required.

In order to ensure flexibility, respective layers of such a flexible display panel should have gradually decreased thicknesses. In this case, thicknesses of layers between the second electrode 126 and the touch sensor TS should not be increased. Therefore, a parasitic capacitance between the second electrode 126 and the touch electrode 152 or 154 of the touch sensor TS is determined by an overlap area and a dielectric provided therebetween, and in the above situation in which the thickness of the dielectric is decreased, maintenance of the parasitic capacitance between the second electrode 126 and the touch sensor TS is further required.

In the display panel in accordance with the present invention, a pattern extending from at least one of the first or second touch electrodes 152 or 154 of the touch sensor TS is used as the first sensing pattern 215 (with reference to FIG. 5), a pattern of the second electrode 126 used in the light emitting device 120 is left as is, the second sensing pattern 232 provided with an electrode connection part with the second electrode 126 in the non-active area and having the same potential as the second electrode 126 is provided at a different position from the second electrode 126, and thereby, electrical stability of the light emitting devices 120 and convenience in defect detection are simultaneously achieved.

The second sensing pattern 232 and the first auxiliary sensing pattern 222 electrically connected to the second sensing pattern 232 are formed as island-type patterns separated from the first electrode 122 of the light emitting device 120 in the subpixel, in the same layer as the first electrode 122 of the light emitting device 120. Further, the second sensing pattern 232 protruding to the outside of the active area AA is located outside the encapsulation stack 140 so that a measurement apparatus can be directly connected to the second sensing pattern 232.

The second sensing pattern 232 is located in the same layer as the first electrode 122, but is exposed from the encapsulation stack 140 at the outside of the encapsulation stack 140 in a planar fashion. The first electrode 122 can be formed of a first electrode material including, for example, a transparent electrode, such as ITO or the like, and, in this case, when the second electrode 126 and the first auxiliary sensing pattern 222 are connected through a second electrode connection hole CTA and then the first electrode material covers the substrate 111 up to the edge of the substrate 111, sheet resistance is increased by the transparent electrode. Therefore, the connection metal 236 formed in the same layer as the source and drain electrodes 136 and 138 and a plurality of first connection parts CT (CT1 and CT2) are provided between the second sensing pattern 232 exposed at the edge of the substrate 111 and the first auxiliary sensing pattern 222. The connection metal 236 functioning as a bridge between the first auxiliary sensing pattern 222 having an interlayer structure by lower insulating films 116 and 118 and the second sensing pattern 232 connected directly to the upper surface of the connection metal 236 has a plurality of island-type connection patterns 242 located in the same layer as the first electrode 122, and thus lower resistance in a connection region.

The source/drain electrodes 136 and 138 are formed of a low-resistance metal, thus lowering sheet resistance of the second sensing pattern 232 and raising reliability of detection.

The first sensing pattern 215 is located on the encapsulation stack 140 and is exposed to the outside, and the second sensing pattern 232 extends farther than the encapsulation stack 140 and protrudes from the encapsulation stack 140 in a planar fashion. Therefore, a capacitance between the first and second sensing patterns 215 and 232, which are exposed to the outside and thus observed from the outside, can be measured by the measurement apparatus.

The encapsulation stack 140 includes, for example, at least one organic encapsulation film 144 and at least one inorganic encapsulation film 142 and 146, the organic encapsulation film 144 which has excellent ability to cover foreign substances but is vulnerable to moisture is located inside the inorganic encapsulation films 142 and 146, and only the inorganic encapsulation films 142 and 146 are located to correspond to the edge region of the substrate 111. However, the inorganic encapsulation films 142 and 146 is not aligned with the end of the edge line of the substrate 111, and the reason for this is to avoid a laser trimming line at the edge of the substrate 111 to cut the substrate 111 into unit panels by irradiating a laser. As exemplarily shown in FIG. 4, the inorganic encapsulation films 142 and 146 are located inside the edge line of the substrate 111.

The second sensing pattern 232 is exposed to be located outside the inorganic encapsulation films 142 and 146, and for this purpose, the second sensing pattern 232 can be formed to be aligned with the edge line of the substrate 111, but is not necessarily aligned with the edge line of the substrate 111. For example, if the substrate 111 includes a bending area at the edge part thereof according to the type of the display panel, the encapsulation stack 140 may not be provided in the bending area, and in this case, only the second sensing pattern 232 can be provided outside the encapsulation stack 140.

Further, the display panel can include at least one dam pattern D1 and D2 provided in the non-active area so as to surround the active area AA.

The dam patterns D1 and D2 are provided prior to formation of the organic encapsulation film 144 so as to prevent the organic encapsulation film 144 from invading the edge of the substrate 111 and to locate the organic encapsulation film 144 in the inner regions of the inorganic encapsulation films 142 and 146, and are formed of the same material as a planarization film 118, a bank 128 and a spacer 129, which are formed through an array formation process.

In an example shown in FIG. 4, the first dam pattern D1 corresponding to the innermost dam pattern is formed by stacking a bank material layer 128a and the spacer 129, and the second dam pattern D2 located outside the first dam pattern D1 is formed by stacking a planarization material layer 118a left when the planarization film 118 provided thereunder is patterned, the bank material layer 128a and the spacer 129, i.e., has a three-layer structure. In this case, the second dam pattern D2 located closer to the edge of the substrate 111 has a greater thickness, and even if an organic encapsulation film material overflows the first dam pattern D1 when the organic encapsulation film 144 is formed, the organic encapsulation film material can be blocked by the second dam pattern D2 higher than the first dam pattern D1.

In some cases, the display panel can further include a third dam pattern D3 formed of a single layer, such as the planarization film material layer 118a or the bank material layer 128a. The first to third dam patterns D1, D2 and D3 can be formed as a closed loop surrounding the active area AA or be provided with an opening at a part thereof in a planar fashion. When a plurality of dam patterns is provided, openings of the respective dam patterns are located at different positions so that the organic encapsulation material does not leak through a specific part.

The power lines 238, the connection patterns 242 and touch routing lines 156 which need to be protected are provided inside the first dam pattern D1, and are protected by the encapsulation stack 140 without exposure to outdoor air.

The connection metal 236 overlaps the dam patterns D1, D2 and D3, and thus, passes between the first auxiliary sensing pattern 222 on the insulating films 116 and 118 and the second sensing pattern 232 connected directly to the upper surface of the connection metal 236.

The touch routing lines 156 can be located between the active area AA and the dam patterns D1, D2 and D3. The touch electrodes 152 and 154 are arranged on the touch routing lines 156, and some of the touch routing lines 156 and the touch electrodes 152 and 156 can have conductive connection parts formed through a touch insulating film 158 interposed therebetween.

The first sensing pattern 215 can be located in the same layer as the touch electrodes 152 and 154 located in the active area AA.

The touch routing lines 156 together with the touch sensor including the touch electrodes 152 and 154 are located on the encapsulation stack 140, and the touch routing lines 156 are connected to the touch electrodes 152 and 154 so that touch drive signals are transmitted to the touch routing lines 156.

Although FIG. 1 illustrates the first auxiliary sensing pattern 222, the second sensing pattern 232 and the connection metal 236 have an inverted "U" shape, the shapes of the first auxiliary sensing pattern 222, the second sensing pattern 232 and the connection metal are not limited thereto and can vary. The first auxiliary sensing pattern 222, the second sensing pattern 232 and the connection metal 236 can have other shapes, for example, an island type, as exemplarily shown in FIG. 2, as long as the respective patterns 222 and 232 have conductive connection(s).

Further, although FIG. 1 illustrates the first sensing pattern 215 as being located within the area of the second sensing pattern 232, the second sensing pattern 232 can be located outside the first sensing pattern 215 in a planar fashion.

The non-active area at one side of the substrate 111 further extends and is provided with pad electrodes connected to a plurality of lines provided in the active area AA, and the respective pad electrodes are connected to a drive circuit board 300 so that signals can be applied to the respective lines. Here, an area in which the pad electrodes are formed is referred to as a pad region PAD.

The display panel in accordance with the present invention can further include link lines connected to the pad electrodes of the pad region PAD and the lines of the active area. The link lines and the connection metal 236 can be formed in the same layer, and be arranged to be spaced apart from each other.

The substrate 111 is generally divided into the active area AA (the area within the dotted line of FIG. 1) arranged at the center of the substrate and the non-active areas arranged outside the active area AA. The illustrated substrate 111 has a rectangular shape having four sides, one of which is provided with the non-active area (outside the active area AA) having a relatively large width, and a printed circuit board 300 is connected to the pad region PAD of the non-active area having a large width.

Here, the substrate 111 is not limited to the rectangular shape, and can have various shapes, such as a polygonal or circular shape, and the illustrated example shows the shape of the display panel which is generally manufactured. In the display panel including the touch sensor TS in accordance with an example of the present invention, by locating display pads DP for a thin film transistor array and touch pads TP at a side of the substrate 111, at which the printed circuit board 300 is provided, regardless of the shape of the substrate 111, connection between pad electrodes for applying signals to the thin film transistor array and the touch sensor TS and the printed circuit board 300 can be unified.

Further, the substrate 111 can be one of a transparent glass substrate, a transparent plastic substrate, an opaque plastic substrate and a reflective metal substrate. Further, the substrate 111 can have flexibility by adjusting the thickness thereof or using a flexible material.

The touch pads TP and the display pads DP provided on the substrate 111 are respectively provided in plural numbers coinciding with the number of the touch electrodes 152 and 154 and the number of scan lines and data lines, and the touch pads TP and the display pads DP are located at the same side of the substrate 111, and, if the touch pads TP and the display pads DP respectively have a multi-layer structure, at least one layer of the touch pads TP and the display pads DP is located on the same plane, and thus, the touch pads TP and the display pads DP are arranged in parallel to be spaced apart from each other without overlapping.

Further, as exemplarily shown in FIG. 2, the subpixels are arranged in a matrix on the active area AA of the substrate 111, the scan lines and the data lines intersect each other to define the subpixels, and a pixel driving circuit and a light emitting device connected to one thin film transistor of the pixel driving circuit are provided at each of intersections between the scan lines and the data lines.

In terms of a layer structure, the display panel including the touch sensor TS in accordance with an example of the present invention, the encapsulation stack 140 is provided to cover the pixel driving circuits including the scan lines and the data lines and the light emitting devices 120 in the active area, and the first and second touch electrodes 152 and 154 arranged to intersect each other are provided on the encapsulation stack 140, as exemplarily shown in FIGS. 2 and 3.

During a touch period, the touch sensor TS senses a change in a mutual capacitance Cm by a touch using a user's finger or a separate object, such as a pen, through the first and second touch electrodes 152 and 154, and thus senses whether or not a touch occurs and senses a touch position if the touch has occurred.

Further, the display panel including the touch sensor TS displays an image through unit pixels during a display period. The unit pixel includes red (R), green (G) and blue (B) subpixels, or red (R), green (G), blue (B) and white (W) subpixels. Otherwise, the unit pixel can include a combination of subpixels to emit light of other colors so as to finally produce white light.

The first and second touch electrodes 152 and 154 are arranged on the encapsulation stack 140, and the mutual capacitance Cm is generated at an overlapping region between the first and second touch electrodes 152 and 154. In some cases, a buffer layer can be additionally provided between second bridges 154b, located at the lowermost position in the first and second touch electrodes 152 and 154, and the inorganic encapsulation film 146. In the display panel in accordance with the present invention, the first and second touch electrodes 152 and 154 are provided with no separate base material or substrate, and are arranged directly on the encapsulation stack 140 without any separate adhesive layer. For instance, when the upper surface of the substrate 111 except for the touch pads TP and the display pads DP is covered with the encapsulation stack 140, the first and second touch electrodes 152 and 154 intersecting each other to generate the mutual capacitance Cm are provided on the encapsulation stack 140 with process continuity so as to detect touch.

Each of the subpixels includes the pixel driving circuit shown in FIG. 2 and the light emitting device 120 connected to the pixel driving circuit. In some cases, the light emitting device 120 can be provided in each of the unit pixels including red (R), green (G) and blue (B) subpixels or red (R), green (G), blue (B) and white (W) subpixels.

The pixel driving circuit includes a switching thin film transistor which can have the same shape as the driving thin film transistor 130 (denoted by T2 in FIG. 3), the driving thin film transistor T2 and a storage capacitor Cst.

When a scan pulse is supplied to the scan line, the switching thin film transistor is turned on and thus supplies a data signal, supplied to the data line, to the storage capacitor Cst and the gate electrode 132 of the driving transistor T2.

The driving thin film transistor T2 controls current I supplied from a high voltage (VDD) supply line to the light emitting device 120 in response to a data signal supplied to the gate electrode 132 of the driving thin film transistor T2, thus adjusting the amount of light emitted from the light emitting device 120. Further, even if the switching thin film transistor is turned off, the driving thin film transistor T2 supplies constant current by voltage charging the storage capacitor Cst until a data signal of a next frame is supplied and, thus, the light emitting device 120 maintains light emission.

Such a driving thin film transistor 130 includes, as exemplarily shown in FIG. 3, the gate electrode 132, a semiconductor layer 134 overlapping the gate electrode 132 with a gate insulating film 112 interposed therebetween, and the source and drain electrodes 136 and 138 formed on the interlayer insulating film 114 and contacting the semiconductor layer 134.

The light emitting devices 120 are arranged in the active area AA of the substrate 111, and the light emitting device 120 includes the first electrode 122, the light emitting layer 124 formed on the first electrode 122, and the second electrode 126 formed on the light emitting layer 124.

The first electrode 122 is electrically connected to the drain electrode 138 of the driving thin film transistor 130 exposed through a pixel contact hole 148 formed through the planarization film 118. The light emitting layer 124 is formed on the first electrode in an emission area prepared by the bank 128. The light emitting layer 124 is formed by stacking a hole transport layer, an organic light emitting layer and an electron transport layer on the first electrode 122 in regular order or in reverse order. The second electrode 126 is formed opposite to the first electrode 122 with the light emitting layer 124 interposed therebetween.

The encapsulation stack 140 prevents external moisture or oxygen from permeating the light emitting devices 120. For this purpose, the encapsulation stack 140 includes a plurality of inorganic encapsulation films 142 and 146 and an organic encapsulation film 144 arranged between the inorganic encapsulation films 142 and 146, and the inorganic encapsulation film 146 is arranged as the uppermost layer. Here, the inorganic encapsulation films 142 and 146 and the organic encapsulation film 144 are alternately arranged, and the encapsulation stack 140 can include at least two inorganic encapsulation films 142 and 146 and at least one organic encapsulation film 144. In the present invention, the encapsulation stack 140 having a basic structure in which the organic encapsulation film 144 is arranged between the first and second inorganic encapsulation films 142 and 146 will be exemplarily described. The encapsulation stack 140 can further include one or more pair units including an inorganic encapsulation film and an organic encapsulation film in addition to the above basic structure.

The first inorganic encapsulation film 142 is formed on the substrate 111 provided with the second electrode 126 thereon so as to be located closest to the light emitting device 120. Such a first inorganic encapsulation film 142 is formed of an inorganic insulating material which can be deposited at a low temperature, such as silicon nitride ($SiN_x$), silicon oxide ($SiO_x$), silicon oxynitride (SiON) or aluminum oxide ($Al_2O_3$). Since the first inorganic encapsulation film 142 is deposited in a low-temperature atmosphere, damage to the light emitting layer 124, which is vulnerable to a high-temperature atmosphere, during a deposition process of the first inorganic encapsulation film 142, can be prevented.

The organic encapsulation film 144 serves as a buffer to reduce stress between the respective layers according to bending of the display panel and strengthens planarization performance of the display panel. The organic encapsulation film 144 is formed of an organic insulating material, such as acrylic resin, epoxy resin, polyimide, polyethylene or silicon oxycarbide (SiOC).

The second inorganic encapsulation film 146 is formed on the substrate 111 provided with the organic encapsulation film 144 thereon so as to cover the upper and side surfaces of the organic encapsulation film 144. Thereby, the second inorganic encapsulation film 146 minimizes or prevents permeation of external moisture or oxygen into the organic encapsulation film 144. The second inorganic encapsulation film 146 is formed of an inorganic insulating material, such as silicon nitride ($SiN_x$), silicon oxide ($SiO_x$), silicon oxynitride (SiON) or aluminum oxide ($Al_2O_3$). The first and second inorganic encapsulation films 142 and 146 can be formed of the same material, and each of the first and second inorganic encapsulation films 142 and 146 can have a multi-layer structure.

The thickness of the organic encapsulation film 144, which occupies the majority of the total thickness of the encapsulation stack 140, can be about 5 to 20 times the thickness of the single inorganic encapsulation film 142 or 146.

The encapsulation stack 140 can have the total thickness of 6 μm to 30 μm so as to prevent permeation of external moisture and flow and influence of inner particles. As curvature of the display panel is increased, the thickness of the encapsulation stack 140 can be decreased.

The encapsulation stack 140 is configured to cover at least the active area AA, and thus, the side portion of the encapsulation stack 140 is located in the non-active area. Exposure of the side portion of the encapsulation stack 140 to the non-active area is limited to the inorganic encapsulation films 142 and 146. For example, the organic encapsulation film 144 is located farther inward than the first and second inorganic encapsulation films 142 and 146 formed under and on the encapsulation film 144 to be close to the active area AA, and the second inorganic encapsulation film 146 formed on the organic encapsulation film 144 covers the upper and side surfaces of the organic encapsulation film 144 and extends farther than the encapsulation film 144 to meet the first inorganic encapsulation film 142 protruding farther than the organic encapsulation film 144 at the side surfaces thereof.

The first touch electrodes 152 and the second touch electrodes 154 are arranged on such an encapsulation stack 140.

The gate insulating film 112 shown in FIG. 3 corresponds to a kind of buffer layer and functions to prevent impurities on the substrate 111 from being introduced into the thin film transistor array provided on the substrate 111. In some cases, a buffer layer can be further provided between the gate insulating film 112 and the substrate 111.

Further, an organic film 261 and an in organic film 262 can be further provided on the touch electrodes 154 located at the uppermost position of the touch sensor TS of FIG. 4, as protective films.

The inorganic film 262 can be located farther outward than the organic film 261, and a part of the first sensing pattern 215 can be exposed to the outside of the inorganic film 262. Since the first sensing pattern 215 can have an exposure area which is sufficient to be detected by the measurement apparatus, only a part of the first sensing pattern close to the non-active area can be exposed.

For this purpose, the inorganic film 262 can be located inside the inorganic encapsulation films 142 and 146 of the encapsulation stack 140 so as to prevent formation of moisture permeation paths. The organic film 261 can be formed of the same material as the organic encapsulation film 144, and the inorganic film 262 can be formed of the same material as the first and second inorganic encapsulation films 142 and 146.

In some cases, instead of the stacked organic film 261 and inorganic film 262, a single inorganic protective film can be used, or a plurality of organic and inorganic protective films can be stacked. Otherwise, the upper surface of the touch sensor TS can be covered directly with a cover window. The cover window can further include a light shielding layer to prevent the edge area (non-active area) from being visible. In some cases, the cover window can include a louver pattern provided in the active area AA to control light, and thus adjust viewing angle characteristics so as to block light having other viewing angles except for a specific viewing angle.

Now, an arrangement of the touch sensor TS will be described with reference to FIGS. 4 and 5.

As exemplarily shown in FIGS. 4 and 5, the first and second touch electrodes 152 and 154 are formed on the encapsulation stack 140.

The first and second touch electrodes 152 and 154 are arranged in directions which intersect each other, one of the first and second touch electrodes 152 and 154 functions as a touch driving line, and the other of the first and second touch electrodes 152 and 154 functions as a touch sensing line.

The first touch electrode 152 includes a plurality of first touch patterns 152e arranged in a Y direction and bridges 152b to integrally connect adjacent first touch patterns 152e, and the second touch electrode 154 includes a plurality of second touch patterns 154e spaced apart from each other in an X direction and second bridges 154b formed in a different layer from the second touch patterns 154e to conductively connect adjacent second touch patterns 154e.

The first touch patterns 152e and the second touch patterns 154e are formed in the same layer. Further, the touch insulating film 158 is interposed between the second bridges 154b and the first and second touch patterns 152e and 154e.

The second bridges 154b are located in the different layer from the first touch patterns 152e and the second touch patterns 154e with the touch insulating film 158 interposed between the second bridges 154b and the first and second touch patterns 152e and 154e, and are connected to the second touch patterns 154e through touch connection holes 150 provided through the touch insulating film 158, at the intersections between the first touch electrodes 152 and the second touch electrodes 154.

The first bridges 152b can be formed integrally with the first touch patterns 152e.

Here, each of the touch pads TP can include a touch pad electrode 170 having a plurality of layers, and the touch routing lines 156 can be formed together with formation of the first and second touch electrodes 152 and 154 and be located in the same layer as the second bridges 154b, as exemplarily shown in FIG. 3. Although FIG. 5 illustrates an example in which the second touch electrodes 154 arranged in the horizontal direction include the second bridges 154b formed in a different layer from the second touch patterns 154e, another example in which the first touch electrodes 152 arranged in the vertical direction include the first bridges 152b formed in a different layer from the first touch patterns 152b can be applied.

Further, although the structure of the first and second touch electrodes 152 and 154 of FIG. 3 illustrates that the second bridges 154b are arranged in a different layer from the layer of first and second touch patterns 152e and 154e under the first and second touch patterns 152e and 154e, the structure of the first and second touch electrodes 152 and 154 is not limited thereto, and the layer of the first and second touch patterns 152e and 154e and the layer of the second bridges 154b can be exchanged.

Further, the first and second touch patterns 152e and 154e are not limited to a single layer, as described above, and, in some cases, in order to prevent RC relay and to improve touch sensitivity, the first and second touch patterns 152e and 154e can have a structure in which a mesh pattern formed of a metal and provided as a mesh is stacked on a touch pattern formed of a transparent electrode material and having a polygonal shape having a designated area. In this case, the mesh pattern can be arranged under or on the touch pattern formed of the transparent electrode material so as to contact the touch pattern, or, in some cases, the mesh pattern can be arranged on and under a transparent electrode. Otherwise, the first and second touch patterns 152e and 154e can be formed by locating the transparent electrode having a designated area on and under the mesh pattern.

Here, the mesh pattern can be formed of at least one selected from the group consisting of Al, Ti, Cu and Mo, or an alloy including one thereof, and the transparent electrode can use a transparent conductive film formed of indium tin oxide (ITO) or indium zinc oxide (IZO). When the mesh pattern has a very small line width, lowering of an aperture ratio or lowering of transmittance can be prevented even if the mesh pattern is located on the transparent electrode.

The touch routing lines 156 can be formed in the same layer as the second bridges 154b, which are located in the different layer from the first and second touch patterns 152e and 154e and formed of a metal, or, if mesh patterns are provided, be provided in the same layer as touch patterns having the mesh patterns.

Figure 6:
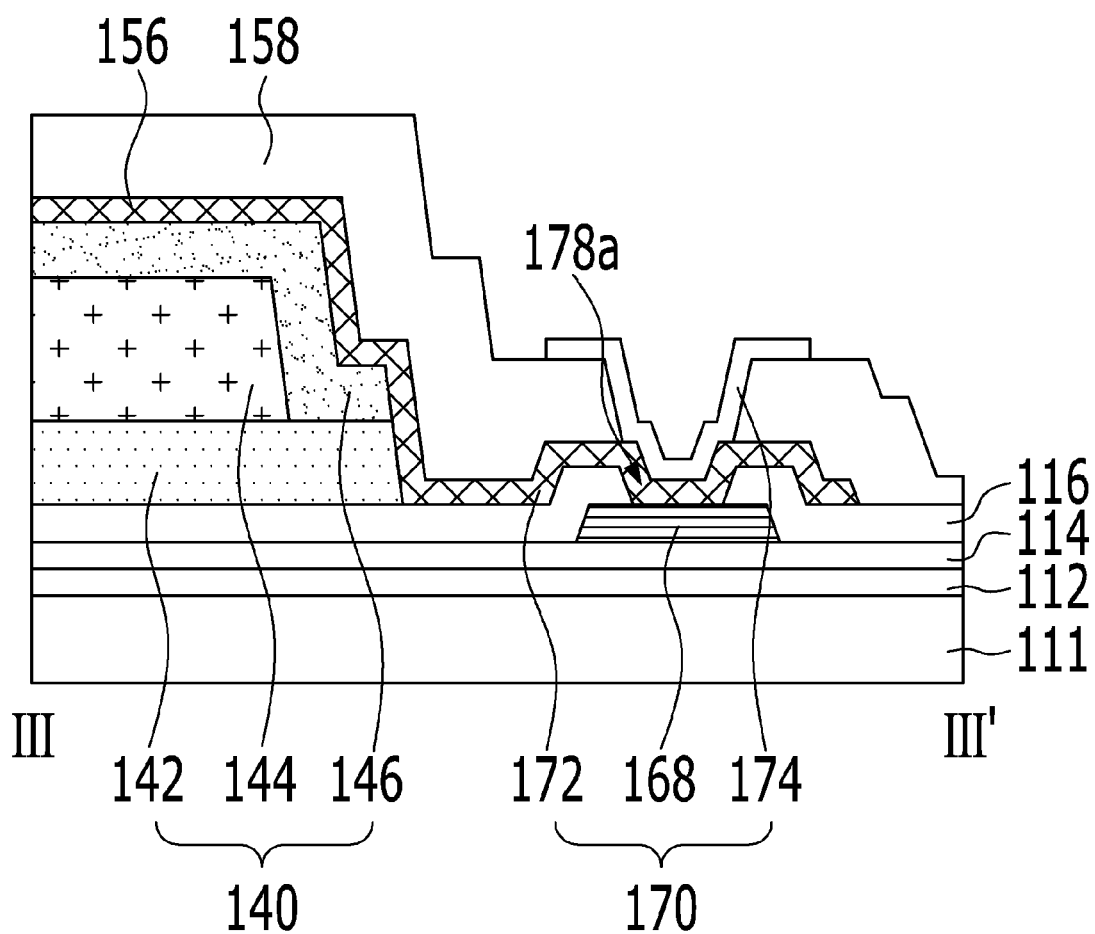
FIG. 6 is a cross-sectional view illustrating a touch pad of FIG. 5, taken along line III-III'.

In more detail, referring to FIGS. 5 and 6, the touch pad electrodes 170 in the touch pads TP completed after formation of the first and second touch electrodes 152 and 154 are located in parallel to array pad electrodes in the display pads DP.

The touch pad electrode 170 can be formed by stacking a first touch pad pattern 168 formed in the same layer as the data lines on the interlayer insulating film 114, a second touch pad pattern 172 extending from the touch routing line 156 located on the encapsulation stack 140, and a third touch pad pattern 174 formed in the same layer as the first and second touch pad patterns 152e and 154e. Some of the first and second and third touch pad patterns 168, 172 and 174 can be omitted, and thus, the touch pad electrode 170 having a monolayer or double-layer structure can be formed.

Further, an area indicated by CA in FIG. 5 is an area in which the encapsulation stack 140 is arranged, and, in an illustrated example, the encapsulation stack 140 is exposed in a region where the touch pads TP and the display pads DP are provided, the first sensing pattern 215 connected to the first and second touch electrodes 152 and 154 of the touch sensor TS (in FIG. 3) is exposed at the upper edge of the encapsulation stack 140, and the second sensing pattern 232 formed in the same layer as the first electrode 122 is exposed at the outside of the encapsulation stack 140. Both terminals of the measurement apparatus are connected to the exposed first and second sensing patterns 215 and 232, and the measurement apparatus measures a capacitance therebetween.

The first sensing pattern 215 is electrically connected to the touch electrodes 152 and 154, the second sensing pattern 232 is electrically connected to the second electrode 126. Although the touch electrodes 152 and 154 and the second electrode 126 are overlapped in the active-area, it is possible to measure a parasitic capacitance Cp between the touch sensor TS and the second electrode 126 by the first sensing pattern 215 and the second sensing pattern 232 positioned in the non-active area. In one or examples of the present invention, the measurement apparatus at the edge of the substrate 111 directly measures a capacitance between the first sensing pattern 215 and the second sensing pattern 232 and can thus measure a parasitic capacitance Cp between the touch sensor TS having the first and second touch electrodes 152, 154 and the second electrode 126.

Figure 7:
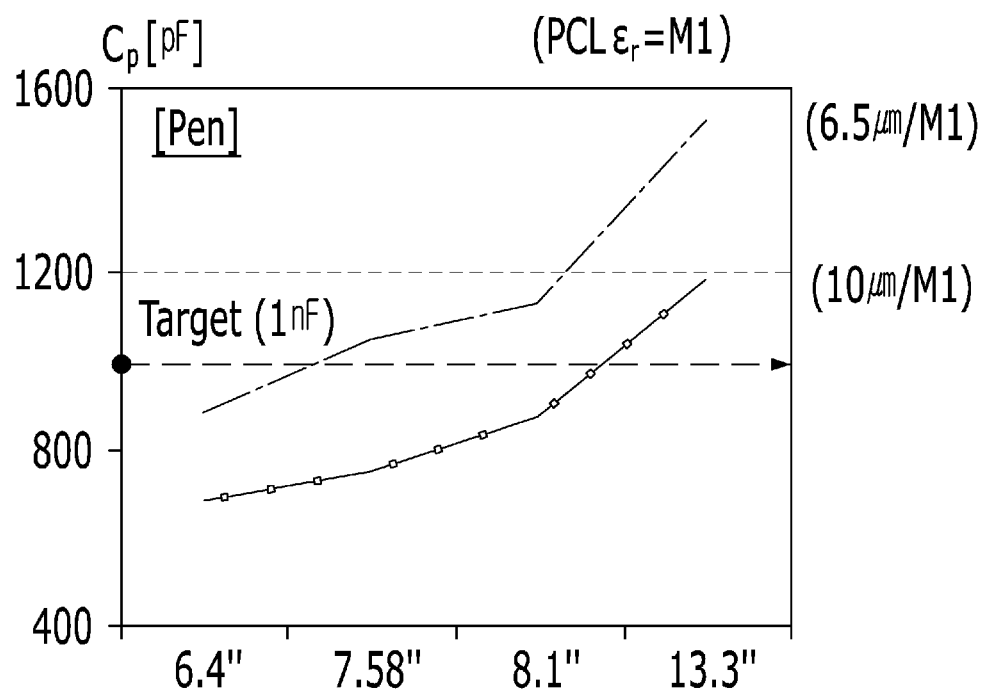
FIG. 7 is a graph representing changes in a parasitic capacitance according to sizes of screens of flexible display panels with respect to a pen touch.

FIG. 7 is a graph representing changes in a parasitic capacitance according to sizes of screens of flexible display panels with respect to a pen touch.

As exemplarily shown in FIG. 7, as the size of the screen of the flexible display panel is gradually increased from 6.4 inches to 13.3 inches, the measured value of a parasitic capacitance $C_p$ tends to be gradually increased. The reason for this is that a resistance is increased due to an increase in the number of lines provided in the display panel.

In order to prevent an error in touch recognition, the flexible display panel in accordance with one or more embodiments of the present invention is aimed to manage a parasitic capacitance to be maintained at a reference parasitic capacitance value of about 1 nF or less.

Among the second electrode 126 corresponding to a cathode of the light emitting device 120 and the touch electrodes 152 and 154 in the touch sensor TS located on the encapsulation stack 140, the organic encapsulation film 144 of the encapsulation stack 140 occupies the majority of the total thickness, and, among dielectrics located between the second electrode 126 and the touch electrodes 152 and 154, the dielectric constant (M1=2.8) of the organic encapsulation film 144 has the greatest effect on the determination of the parasitic capacitance $C_p$. In a test, the dielectric constant of the organic encapsulation film 144 was set to 2.8, and changes in the parasitic capacitance $C_p$ if the organic encapsulation film 144 has different thicknesses, i.e., 6.5 μm and 10 μm, when pen touch is applied, were detected.

In this case, if the thickness of the organic encapsulation film 144 is 6.5 μm, the parasitic capacitances of flexible display panel models having a greater screen size than 6.4 inches except for a flexible display panel model having a screen size of 6.4 inches, exceeded the reference parasitic capacitance value.

On the other hand, if the thickness of the organic encapsulation film 144 is 10 μm, the parasitic capacitances of all the flexible display panel models except for the flexible display panel model having the greatest screen size of 13.3 inches, did not exceed the reference parasitic capacitance value.

For example, it can be understood that, in order to prevent an error in touch recognition, the thickness of the organic encapsulation film of the encapsulation stack of the flexible display panel is maintained preferably at 10 μm or more.

Figure 8:
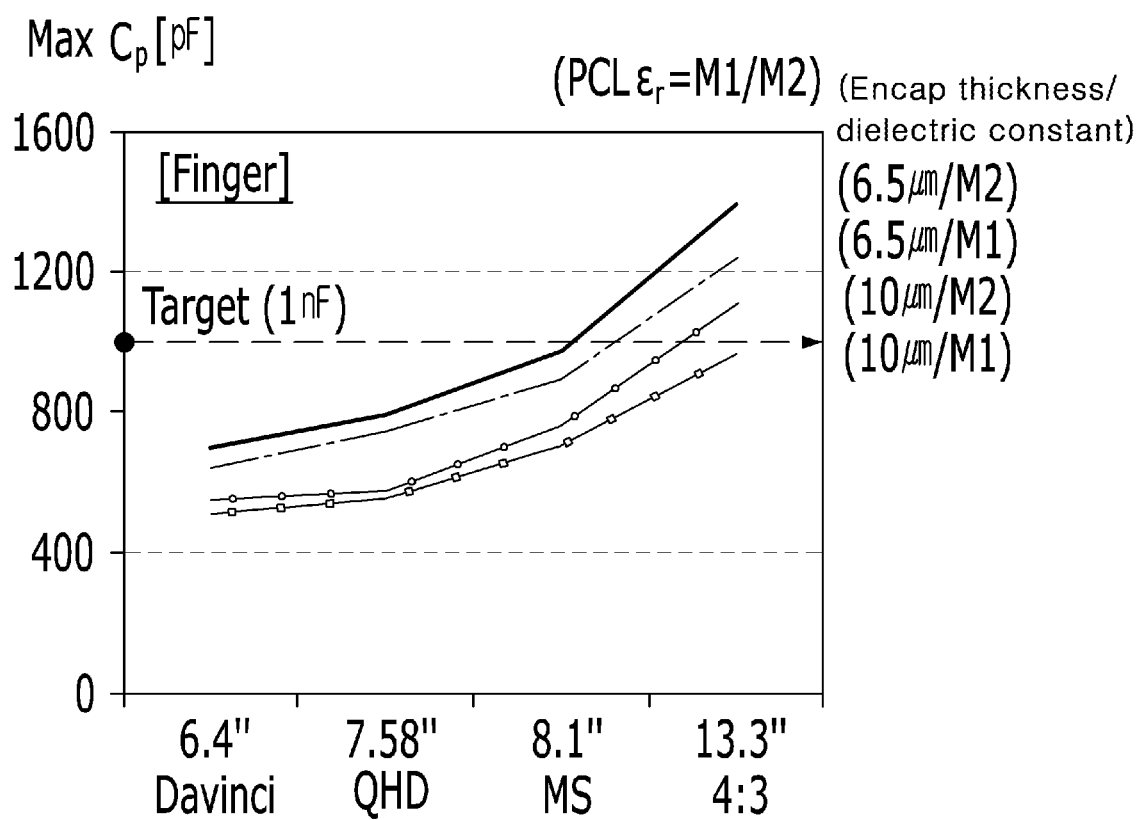
FIG. 8 is a graph representing changes in a parasitic capacitance according to sizes of screens of flexible display panels with respect to a finger touch.

FIG. 8 is a graph representing changes in a parasitic capacitance according to sizes of screens of flexible display panels with respect to a finger touch.

As exemplarily shown in FIG. 8, as the size of the screen of the flexible display panel is gradually increased from 6.4 inches to 13.3 inches, the measured value of a parasitic capacitance $C_p$ tends to be gradually increased. The reason for this is that resistance is increased due to increase in the number of lines provided in the display panel.

In the same manner as the above-described case of pen touch, in order to prevent an error in touch recognition, parasitic capacitances of flexible display panel models having different screen sizes were measured using a reference parasitic capacitance value of about 1 nF.

Here, M1 indicates use of an organic encapsulation film formed of a material having a dielectric constant of 2.8, M2 indicates use of an organic encapsulation film formed of a material having a dielectric constant of 3.2, and parasitic capacitances of the flexible display panel models when touching using a finger were detected.

In this case, it can be confirmed that, if the thickness of the organic encapsulation film 144 is 10 μm, the parasitic capacitance of the flexible display panel model having a relatively low dielectric constant was lower, but parasitic capacitances of almost all flexible display panel models were lower than the reference parasitic capacitance value.

Further, it can be confirmed that, if the thickness of the organic encapsulation film 144 is 6.5 μm, the parasitic capacitances of other flexible display panel models except for the flexible display panel model having the greatest screen size of 13.3 inches did not exceed the reference parasitic capacitance value.

For example, results of the tests of FIGS. 7 and 8, preferably mean that, even if the same flexible display panel is used, an error in touch recognition should be more finely managed in case of pen touch.

Further, it can be understood that, when the organic encapsulation film of the encapsulation stack has a great thickness and a low dielectric constant, an error in touch recognition can be prevented by lowing the parasitic capacitance to a reference value or less.

In the display panel and the defect detection method thereof in accordance with one or more embodiments of the present invention, as exemplarily shown in FIGS. 1 to 6, a parasitic capacitance can be measured by connecting the measurement apparatus directly to the first sensing pattern 215 integrated with the touch electrodes 152 and 154 and the second sensing pattern 232 electrically connected to the second electrode 126, exposed at the edge of the substrate 111 and thus defect detection can be easily carried out and whether or not a unit display panel is defective can be detected prior to application of a module process.

In the display panel in accordance with one or more embodiments of the present invention, a capacitance between the second electrode and the touch sensor can be detected at one side of the non-active area without structural change of the active area.

Further, the first sensing pattern integrated with the touch electrodes of the touch sensor and the second sensing pattern electrically connected to the second electrode are provided in a part of the non-active area, and thus, defect detection is possible without use of the printed circuit board having detection terminals. This preferably means that defect detection is possible in a unit panel state or a mother substrate state which a mother substrate is not cut into respective unit panels rather than in a display module state in which a display panel is connected to a printed circuit board, and loss in a module configuration is prevented and can thus cause yield enhancement.

In addition, as compared to detection after the module process, in the display panel in accordance with one or more embodiments of the present invention, a defect detection is primarily carried out in a unit display panel and thus reliability of the display panel is enhanced. For instance, a defect detection is carried out in a panel state in which a drive unit is not connected to a display panel, and thus a defective panel can be detected in advance.

Further, a parasitic capacitance between the touch sensor and the second electrode is directly measured by an apparatus connected to the first sensing pattern and the second sensing pattern in the non-active area of the unit panel, and thus accuracy and reliability in defect detection can be enhanced.

Furthermore, in order to achieve pattern stability of the second electrode to which equipotential is applied, an electrode pattern formed in the same layer as the other electrode, located under the second electrode and electrically connected to the second electrode can be used directly as the second sensing pattern.

As apparent from the above description, a display panel including a touch sensor and a method for detecting a defect thereof in accordance with one or more embodiments of the present invention have advantages and effects as follows.

First, a capacitance between a second electrode and the touch sensor can be detected at one side of a non-active area without structural change of an active area.

Second, a first sensing pattern integrated with touch electrodes of the touch sensor and a second sensing pattern electrically connected to the second electrode are provided in a part of the non-active area, and thus, a defect detection is possible without use of a printed circuit board having detection terminals. This preferably can mean that a defect detection is possible in a unit panel state or a mother substrate state which a mother substrate is not cut into respective unit panels rather than in a display module state in which a display panel is connected to a printed circuit board, and loss in a module configuration is prevented and can thus cause yield enhancement.

Third, as compared to a detection after the module process, in the display panel in accordance with the present invention, a defect detection is primarily carried out in a unit display panel and thus reliability of the display panel is enhanced. For example, a defect detection is carried out in a panel state in which a drive unit is not connected to a display panel, and thus a defective panel can be detected in advance.

Fourth, a parasitic capacitance between the touch sensor and the second electrode is directly measured by an apparatus connected to the first sensing pattern and the second sensing pattern in the non-active area of the unit panel, and thus accuracy and reliability in defect detection can be enhanced.

Fifth, in order to achieve pattern stability of the second electrode to which equipotential is applied, an electrode pattern formed in the same layer as the other electrode, located under the second electrode and electrically connected to the second electrode can be used directly as the second sensing pattern.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for detecting a defect of a display panel, the method comprising:
    preparing the display panel including a first sensing pattern connected to a touch sensor and a second sensing pattern extended from a light emitting device in an active area of the display panel to a non-active area of the display panel,
    wherein at least one of the first sensing pattern and the second sensing pattern protrudes farther than an end of an encapsulation stack in the non-active area of the display panel, and
    the encapsulation stack covers a second electrode of the light emitting device in the active area and overlaps with the first sensing pattern in the non-active area;
    detecting a parasitic capacitance between the touch sensor and the second electrode in the active area, by measuring a capacitance between the first sensing pattern and the second sensing pattern connected to the second electrode, located in the non-active area;
    comparing the parasitic capacitance with a designated value; and
    determining that the display panel is defective based on a result of the comparing.

2. The method according to claim 1, wherein the display panel further comprises a substrate comprising the active area having a plurality of subpixels, and the non-active area to surround the active area and at least one thin film transistor in each of the subpixels.

3. The method according to claim 2, wherein in the display panel,
    the light emitting device comprises a first electrode connected to the at least one thin film transistor, a light emitting layer connected to the first electrode, and the second electrode disposed on the substrate,
    the encapsulation stack comprising at least one organic encapsulation film and at least one inorganic encapsulation film disposed on the light emitting device, and
    the touch sensor comprising a plurality of touch electrodes disposed on the encapsulation stack in the active area.

4. The method according to claim 3, wherein the plurality of touch electrodes include a first touch electrode arranged in a first direction and a second touch electrode arranged in a second direction that intersects with the first direction,
    wherein the first touch electrode is configured as a touch driving line, and the second touch electrode is configured as a touch sensing line,
    wherein the first touch electrode includes first touch patterns and first bridges integrally connecting adjacent first touch patterns among the first touch patterns, and
    wherein the second touch electrode includes second touch patterns spaced apart from each other and second bridges formed in a different layer than the second touch patterns and electrically connecting adjacent second touch patterns among the second touch patterns.

5. The method according to claim 4, wherein each of the first and second touch patterns comprises a mesh pattern formed of a metal.

6. The method according to claim 3, wherein the first sensing pattern extends from at least one of the plurality of touch electrodes toward the non-active area, and
    wherein the second sensing pattern is formed by a same metal layer as the first electrode, around the first sensing pattern.

7. The method according to claim 3, wherein the at least one inorganic encapsulation film is interposed between the first sensing pattern and the second sensing pattern.

8. The method according to claim 7, wherein the second sensing pattern is exposed from the at least one inorganic encapsulation film.

9. The method according to claim 3, wherein a connection metal is in a same layer as at least one electrode of the at least one thin film transistor, in the non-active area to connect the second electrode to the second sensing pattern, and
    wherein the connection metal has a plurality of island-type connection patterns located in a same layer as the second sensing pattern.

10. The method according to claim 9, wherein a first auxiliary sensing pattern connects the connection metal to the second electrode extending to the non-active area, and
    wherein the first auxiliary sensing pattern is positioned below a bank which defines light emitting areas of the subpixels.

11. The method according to claim 10, wherein power lines are included on the substrate, and
    wherein the first auxiliary sensing pattern is positioned between the bank and the power lines.

12. The method according to claim 9, wherein at least one dam pattern is in the non-active area and is configured to surround the active area.

13. The method according to claim 12, wherein the at least one dam pattern comprises a first dam pattern and a second dam pattern located outside the first dam pattern, the second dam pattern having a height higher than the first dam pattern.

14. The method according to claim 13, wherein the at least one dam pattern further comprises a third dam pattern located outside the second dam pattern.

15. The method according to claim 14, wherein at least one of the first, second and third dam patterns overlaps the connection metal, and
    wherein the third dam pattern overlaps a step portion of the second sensing pattern contacting the connection metal.

16. The method according to claim 14, wherein a protective film is on the touch sensor, and is configured to protect the touch sensor.

17. The method according to claim 16, wherein the protective film extends to the non-active area and covers the first and second dam patterns, and
    wherein the protective film exposes the first sensing pattern and the second sensing pattern in a part of the non-active area.

18. The method according to claim 16, wherein the protective film comprises an organic protective film and an inorganic protective film.

19. The method according to claim 13, wherein at least one of the first and second dam patterns overlaps the second sensing pattern.

20. The method according to claim 12, wherein touch routing lines are provided between the active area and the at least one dam pattern.

21. The method according to claim 1, wherein the determining that the display panel is defective includes: determining that the parasitic capacitance is greater than the designated value; and
- in response to the determining that the parasitic capacitance is greater than the designated value, determining that the display panel is defective.

22. The method according to claim 1, further comprising:
- determining that the parasitic capacitance is less than or equal to the designated value; and
- in response to the determining that the parasitic capacitance is less than or equal to the designated value, determining that the display panel is non-defective.

* * * * *